United States Patent [19]

Stoneburner

[11] Patent Number: 4,468,788
[45] Date of Patent: Aug. 28, 1984

[54] DIGITAL FREQUENCY TRANSLATOR FOR OFFSET FREQUENCY GENERATION OF UNMODULATED SIGNALS

[75] Inventor: G. David Stoneburner, Mishawaka, Ind.

[73] Assignee: The Bendix Corporation, Teterboro, N.J.

[21] Appl. No.: 416,997

[22] Filed: Sep. 13, 1982

[51] Int. Cl.³ .............................................. H03K 7/06
[52] U.S. Cl. ........................................ 375/23; 377/39; 375/50; 375/61; 375/77; 332/9 R; 331/177 R
[58] Field of Search ................... 375/1, 22, 23, 50, 61, 375/66, 77; 377/39, 45, 54; 455/109, 110, 112; 331/37, 42, 177 R; 332/10, 45, 16 R, 9 R Primary Examiner—Robert L. Griffin
Assistant Examiner—Albert W. Watkins
Attorney, Agent, or Firm—Stanley N. Protigal; Anthony F. Cuoco

[57] ABSTRACT

A frequency translator receives an input frequency signal and an offset frequency signal, and processes the signals digitally in order to obtain an output from a multiplexer. Pulse trains derived from the input frequency are provided to an N-bit shift register. The outputs from the shift register are provided to a multiplexer which is controlled by count signals from the offset frequency. The multiplexer provides, as its output, a single sideband output at a frequency equal to $(f_c - f_{os})/N$, or $(f_c + f_{os})/N$.

13 Claims, 2 Drawing Figures

DIGITAL FREQUENCY TRANSLATOR FOR OFFSET FREQUENCY GENERATION OF UNMODULATED SIGNALS

BACKGROUND OF THE INVENTION

This invention relates to a device which converts an input frequency to a frequency which has been offset by a given amount determined by an offset frequency. The output of the device is a pulse train representative of a single sideband transmission at the offset frequency. This device is particularly useful where it is desired to receive a return signal from a transmitted signal where the transmitted signal is expected to shift in a random manner across a given frequency range. By offsetting the frequency of the returned signal in accordance with the change in frequency of the transmitted signal, a converted frequency can be obtained which is maintained within a narrow band width so that accurate measurements may be made of the return signal.

In the prior art, sideband signals have generally been produced by a filter method and by a phasing method. The filter method involves the use of a band pass filter having sufficient selectivity to pass one sideband and reject the other. Normally, (modulated) oscillator output at a filter frequency is filtered so that only the upper or lower sideband appears at the output. This resulting signal is mixed with an RF oscillator to produce a desired output frequency.

According to the phasing method, a modulating signal is split into two components having a 90 degree phase difference. An oscillator output is also split into two phases having a 90 degree phase separation. The modulation signal phases are combined with the oscillator signal phases in balanced modulators and the combined output results in one sideband being cancelled and the other being augmented. In each of these arrangements, fine adjustments must be made either to the filter or to the phasing and balanced modulators.

In tracking signals having varying frequencies it is necessary to use one of various methods to receive the varying frequencies with a single tuner. The most common technique is to heterodyne the signal, thereby allowing a received signal to be detected with a high degree of selectivity, even though the receiver must be able to detect signals at more than one frequency. In the case of random noise-generated transmissions, rapid responses are needed to track the signal. If such a signal can be accurately tracked, despite large variations in its frequency, an anti-jamming capability is achieved. The use of a single sideband also increases the signal-to-noise ratio of a detected signal, provided that the single sideband can be accurately detected by detecting circuitry.

Normally, shifting in the frequency of a single sideband transmission results in difficulties in properly tuning the transmission. For this reason, it is desired that an accurate and reliable means be provided to generate a single sideband signal and to overcome the problems caused by a signal varying in frequency as it is being received.

SUMMARY OF THE INVENTION

Accordingly, this invention contemplates a circuit which receives an input frequency and an offset frequency and produces, in pulse or square wave form, a single sideband output at a frequency proportional to the difference between the input frequency and an offset frequency. Therefore, if the offset frequency is varied by the same number of hertz as the input frequency, the output of the device will remain at the same nominal frequency. In a preferred embodiment of the invention, a digital sideband generator receives a clock signal having a frequency proportional to an input frequency. The signal is provided to a clock input to an N-stage shift register and the shift register receives the clock signal divided by N as its data signal. The output from the shift register is provided to an N-line multiplexer having K control lines, where K equals $\log_2 N$. An offset frequency is provided to a divide by N counter, with K outputs of the counter being provided to K control inputs in the multiplexer. The K inputs introduce a phase rate so that the multiplexer may provide as its output a single sideband signal.

DETAILED DESCRIPTION OF THE PREFERRED EMBODIMENT

Figure 1:
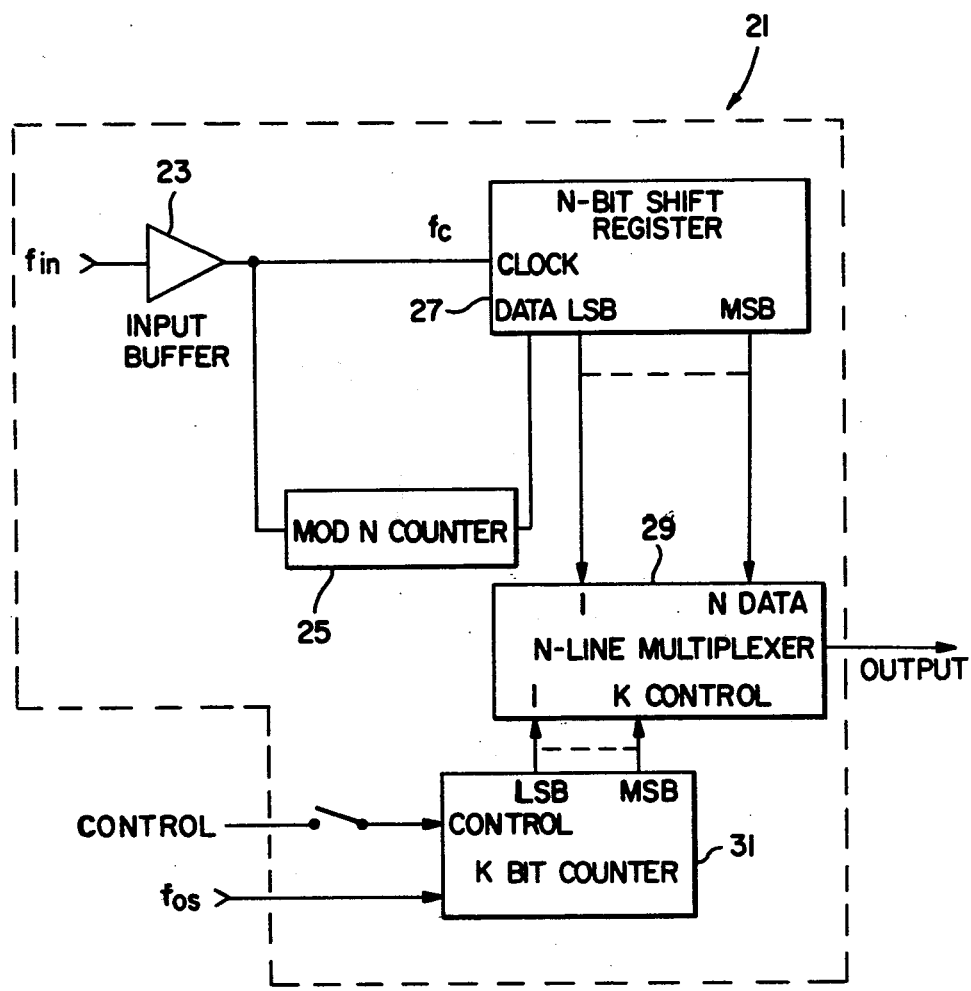
FIG. 1 is a schematic representation of a block diagram of a digital frequency translator according to a preferred embodiment of the invention.

Referring to FIG. 1, a frequency translator 21, according to the preferred embodiment of the invention, receives an input frequency $f_{in}$ and an offset frequency $f_{os}$. The input frequency $f_{in}$ is processed by an input buffer 23 which preferrably provides as its output a digital pulse train occurring at a clock frequency $f_c$, with a time period to successive pulses of $t_c$. In the preferred embodiment of the invention, $f_{in}$ is equal to $f_c$, although it is anticipated that the input buffer may also be used to process the signal to provide an $f_c \neq f_{in}$. In any case, $f_c$ would be proportional to $f_{in}$, so that $f_c = Cf_{in}$, where C is constant. $f_c$ is provided to a mod N counter 25 which divides $F_c$ by N and functions as a divide by N counter.

An N-stage shift register 27 receives the output from the input buffer 23 as a clock input and receives the output from the mod N counter 25 as a data input. The shift register 27 has N outputs, each representing an integer i, where the integers progress from a least significant bit (LSB) to a most significant bit (MSB) in a sequence such that i equals 1, 2, 3, ..., N. 1 is the least significant bit and N is the most significant bit. The shift register 27 therefore provides outputs which are delayed in time by $(i) \times (t_c)$.

It should be noted that the designation, "LSB", as used in this specification, refers to the least significant bit and should not be confused with, "lower sideband", which is spelled out throughout this specification.

An N-line multiplexer 29 is connected to the N-stage shift register 27 so that outputs 1–N are connected to data inputs 1–N on the multiplexer 29. The multiplexer has K control inputs designated 1 through K. The number of control inputs K is determined by, $K = \log_2 N$.

A K-bit counter 31 receives a signal at the offset frequency $f_{os}$ and divides the offset frequency $f_{os}$ by N. The mod-K counter 31 has K outputs which are connected by control lines to the control inputs of the multiplexer 29.

The multiplexer 29 provides an output signal which is a pulse train having a frequency $f_{out}$ such that $f_{out} = (f_c \pm f_{os})/N$. The output is a single sideband output, which sideband is determined by the direction of the count of the K-bit counter 31 and the wiring sequence of the K-bit counter 31 to the N-line multiplexer 29. If the K-bit counter is in an up-count mode and the multiplexer control lines progress from the least significant bit to the most significant bit on both the K-bit counter 31 and the multiplexer 29, the multiplexer output will appear as a lower sideband. In order to switch to the upper sideband, it is possible to reverse the wiring of the output from the K-bit counter 31. Alternatively, if the mod K counter 31 is an up-down counter, a control signal can be used to switch the K-bit counter to a down-count mode, thereby resulting in a change of the sideband output from the multiplexer 29. Likewise, it is possible to provide control inputs at other parts of the system, such as the shift register 27 or the multiplexer 29.

Figure 2:
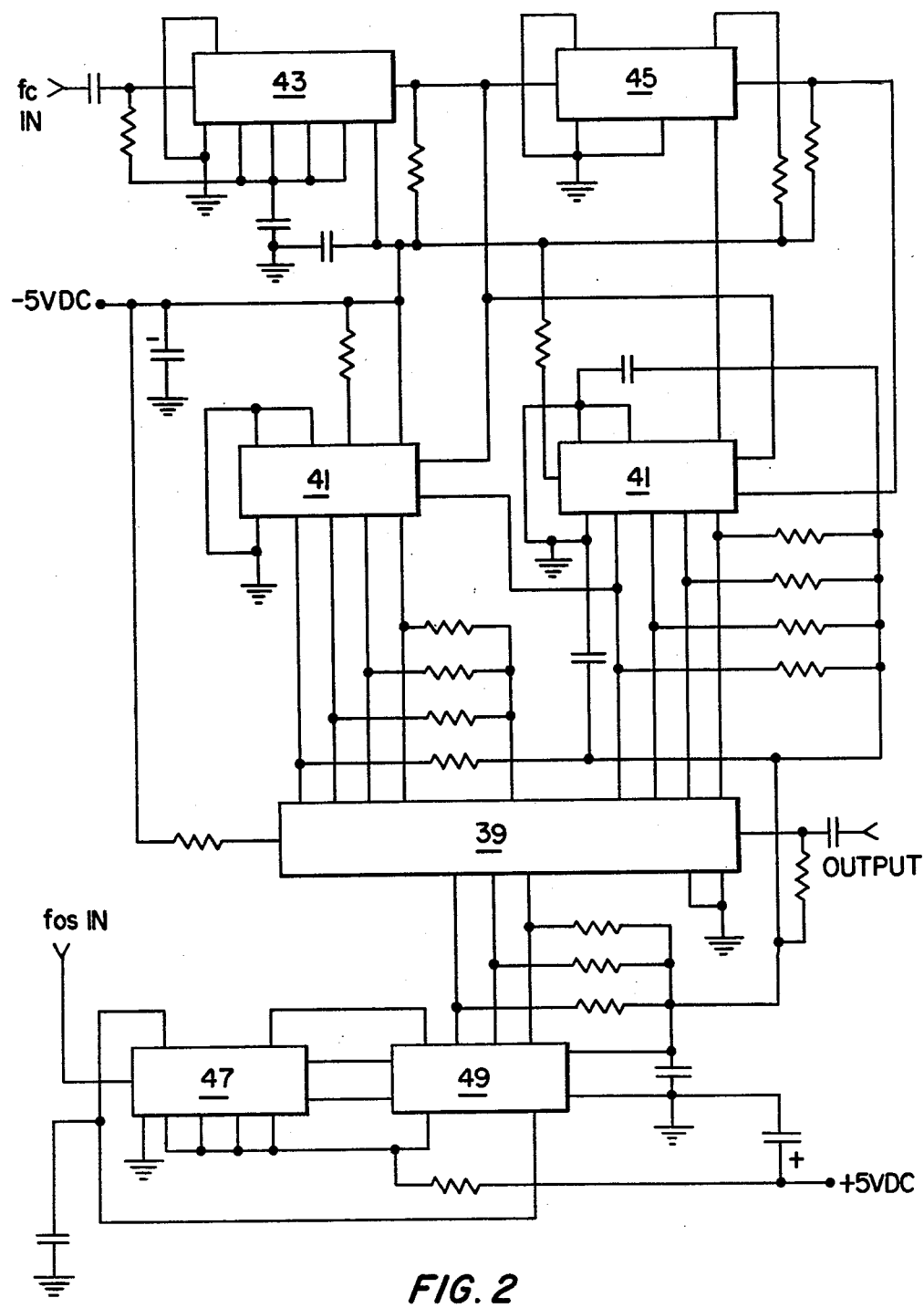
FIG. 2 is a circuit diagram of the digital frequency translator of FIG. 1.

There are, of course, a number of specific ways of constructing circuits to perform the described function. For example, in a prototype design represented by FIG. 2, chip 39 is a multiplexer with three control inputs. In the preferred embodiment, N=8. Therefore, K=3 bits which coincides with the number of control lines on chip 39. In order to provide 8 output bits for the N-stage shift register, a pair of separate integrated circuit elements, shift registers 41, are used in a manner well known to the skilled in the art of constructing digital circuits. In the prototype, the shift register chips 41 may be IC's MC10141 and the multiplexer chip 39 is MC10164, each of which are available from Motorola, Inc. The prototype uses chip 43 as an input buffer and chip 45 a mod N counter, chip 43 being IC MC10116 and chip 45 being IC MC10136, both of which are available from Motorola. The K-bit counter is chip 47, which is preferrably IC 74161 available from Signetics. Chips 39–45 operate in an ECL (emitter coupled logic) format whereas the offset frequency $f_{os}$ is provided to chip 47 in a TTL (transistor-transistor logic) format. The output of chip 47 in the TTL format is translated to the ECL format by an appropriate translator, chip 49, which is preferably IC MC10124, available from Motorola.

The circuits described can be used to generate a selectable offset in frequency and are useful for transmitting unmodulated signals. Thus, if a doppler shift frequency occurs in the kilohertz (KHz) range and is expected to vary with time by several hundred KHz, an offset frequency can be provided to generate an anticipated offset in frequency which would result in the received signal being converted by the frequency translator 21 to the equivalent of a doppler shift frequency which would have resulted from the reception of echos from a single frequency transmission. The offset frequency signal in combination with the frequency translator 21 could be used to track a signal which would otherwise be difficult to discern from outside noise.

It is anticipated that the present system would be most useful for transmitting unmodulated signals. It is also possible to provide an offset frequency $f_{os}$ with a voltage controlled oscillator (VCO, not shown) to maintain a digital signal at an offset which would be controlled by the voltage control oscillator. The frequency translator 21 could then be used as a part of a feedback loop to control the VCO. The use of an offset frequency results in the loop tracking the signal other than by seeking a null condition. The use of a non-null value simplifies further processing of the signal, such as for ranging. Since the output of the multiplexer 29 is in digital form, it is anticipated that in many cases, further signal processing may be necessary. For example, a slave oscillator (not shown) could be used to provide an output which is more compatible with analog devices.

Numerous modifications to the preferred embodiment of the frequency translator can be made. For example, it is possible to eliminate the mod-N counter and provide a frequency multiplier (not shown) which would multiply the input frequency by N, which input would be provided as the clock input to the shift register 27. The data input to the shift register would then be at the frequency $f_{in}$. Accordingly, it can be seen that numerous modifications to the preferred embodiment of the invention can be made within the scope of the invention; and therefore, the invention should be read only as defined by the appending claims.

What is claimed is:

1. A digital sideband generator characterized by:
   (a) means to provide a clock signal having a frequency $f_c$ which is proportional to an input frequency $f_{in}$.
   (b) an N-stage shift register which receives the clock signal as a clock input and receives a signal having a frequency $f_d$ equal to ($f_c/N$) as a data input signal;
   (c) an offset frequency source providing a signal at an offset frequency $f_{os}$;
   (d) a K-bit counter which provides count signals in response to an input from the offset frequency source;
   (e) an N-line multiplexer which receives signal pulses from the N-stage shift register and the count signals from the K-bit counter and provides an input delayed in accordance with the count signals, so that when K equals $\log_2 N$, the multiplexer provides an output at an output frequency equal to $(f_d \pm f_{os})/N$.

2. Apparatus as described by claim 1, characterized in that;
   (a) the clock signal has a time period of $t_c$;
   (b) the shift register provides N outputs, the outputs being designated by a series of integers i, where i equals 1, 2, 3, ..., n; and
   (c) the shift register provides an output which is delayed in time by (i) ($t_c$).

3. Apparatus as described by claim 1, characterized in that a switching means is able to switch the output of the apparatus between lower sideband and upper sideband transmission.

4. Apparatus as described by claim 1, characterized in that the K-bit counter is an up-down counter which is provided with a control input, and the control input switches the up-down counter in order to switch the output of the apparatus between lower sideband transmission and upper sideband transmission.

5. Apparatus as described by claim 1, further characterized in that the shift register has a control input which may be used to switch the output of the apparatus between lower sideband and upper sideband transmission.

6. Apparatus as described by claim 1, characterized in that the K-bit counter is a binary counter.

7. Apparatus as described by claim 1, characterized in that a frequency divider receives a signal having the input frequency and provides as its output the data input signal.

8. Apparatus as described by claim 1, characterized in that a frequency multiplier receives a signal having the input frequency and provides as its output the clock signal.

9. Apparatus as described by claim 1, characterized in that the shift register includes at least two circuit elements.

10. A method for generating pulses for producing sideband signals at an output frequency which is proportional to a difference between an input frequency, $f_{in}$, and an offset frequency, $f_{os}$, characterized by:
   (a) providing an N-stage shift register with a clock signal having a frequency, $f_c$, which is proportional to the input frequency, and providing the N-stage shift register with a data signal having a frequency, $f_d$, equal to the clock frequency divided by N;
   (b) providing an offset frequency signal, having an offset frequency, $f_{os}$, to a K-bit counter, where K equals $\log_2 N$;
   (c) providing outputs from the N-stage shift register to an N-line multiplexer;
   (d) providing the N-line multiplexer with control signals from the K-bit counter, thereby causing the K-bit counter to provide an output from the multiplexer having a frequency equal to $(f_c \pm f_{os})/N$.

11. The method of claim 10, further characterized in that:
   (a) the clock signal is provided at the frequency ($f_{in}$) of the input frequency and
   (b) a frequency divider is used to provide a data input signal by dividing the clock signal by N, thereby causing the output signal from the multiplexer to have a frequency equal to the absolute value of the difference between the input frequency and the offset frequency, divided by N.

12. The method of claim 10, further characterized in that:
   (a) the clock signal is provided to the N-bit shift register by first multiplying the input frequency by N, and
   (b) the data signal is provided to the N-bit shift register at the frequency of the input signal, thereby causing the output from the multiplexer to have a frequency equal to $(f_{in} \pm f_{os})/N$.

13. The method of claim 10, further characterized in that a control line is used for switching the output from the multiplexer between lower sideband and upper sideband.

* * * * *